United States Patent
Ohkuri

(10) Patent No.: US 7,265,617 B2
(45) Date of Patent: Sep. 4, 2007

(54) CLASS-D AMPLIFIER

(75) Inventor: Kazunobu Ohkuri, Kanagawa (JP)

(73) Assignee: Sony Corporation (JP)

( * ) Notice: Subject to any disclaimer, the term of this patent is extended or adjusted under 35 U.S.C. 154(b) by 174 days.

(21) Appl. No.: 11/179,903

(22) Filed: Jul. 12, 2005

(65) Prior Publication Data

US 2006/0012428 A1   Jan. 19, 2006

(30) Foreign Application Priority Data

Jul. 16, 2004   (JP) ............................ P2004-210410

(51) Int. Cl.
*H03F 21/00* (2006.01)
*H03F 3/217* (2006.01)
(52) U.S. Cl. .................... 330/207 A; 330/10; 330/251
(58) Field of Classification Search ..................... None
See application file for complete search history.

(56) References Cited

U.S. PATENT DOCUMENTS 6,118,336 A * 9/2000 Pullen et al. ........... 330/207 A
6,294,954 B1 * 9/2001 Melanson ............... 330/207 A
7,034,609 B2 * 4/2006 Risbo et al. ............ 330/207 A

* cited by examiner

*Primary Examiner*—Khanh Van Nguyen
(74) *Attorney, Agent, or Firm*—Lerner, David, Littenberg, Krumholz & Mentlik, LLP

(57) ABSTRACT

A class-D amplifier has a switching amplifying-unit, which includes a pair of switching elements. The unit drives the switching elements and generates pulse amplified switching signals. The amplifier also has a signal-generating unit, which generates pulse width modulation signals each for driving the switching elements and supplies the generated pulse-width modulation signals to the. switching amplifying-unit. The switching amplifying-unit includes a detecting sub-unit, which detects an operating state of the switching elements. The signal-generating unit includes a dead-time-setting sub-unit, which sets dead time relative to the switching elements by delaying each of the pulse width modulation signals using propagation delay times in logic devices. The signal-generating unit also includes a control sub-unit, which controls the dead-time-setting sub-unit based on a detected result of the detecting sub-unit to change the dead time based on the operating state of the switching elements.

7 Claims, 12 Drawing Sheets

FIG. 1
(RELATED ART)
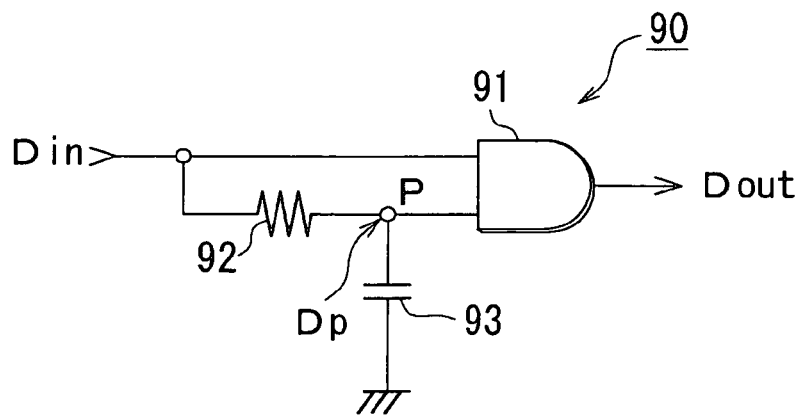
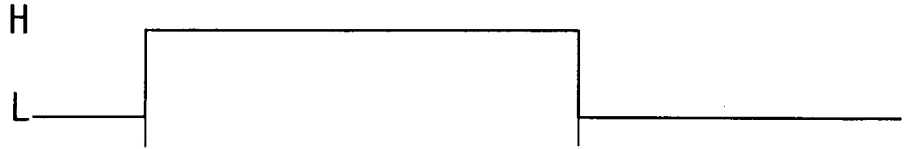
FIG. 2A
(RELATED ART)
(Din)
FIG. 2B
(RELATED ART)
(Dp)
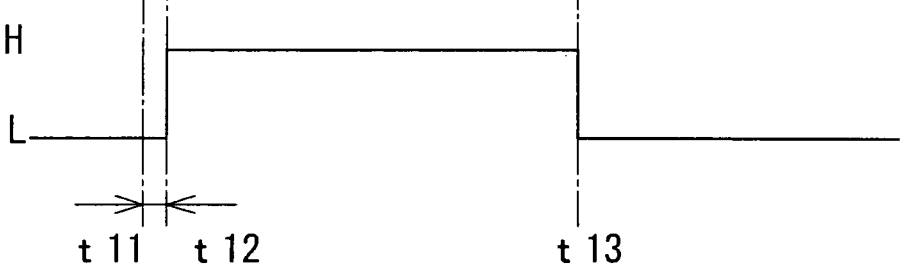
FIG. 2C
(RELATED ART)
(Dout)

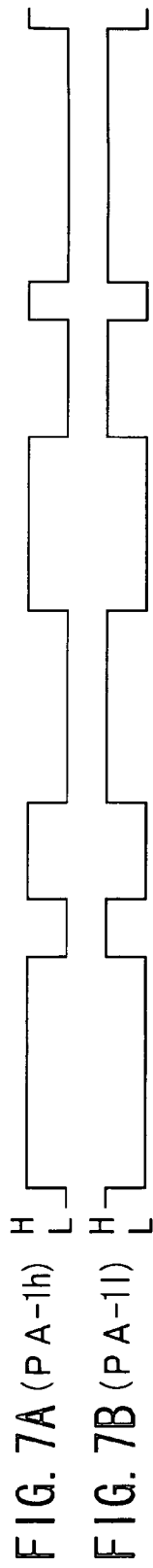
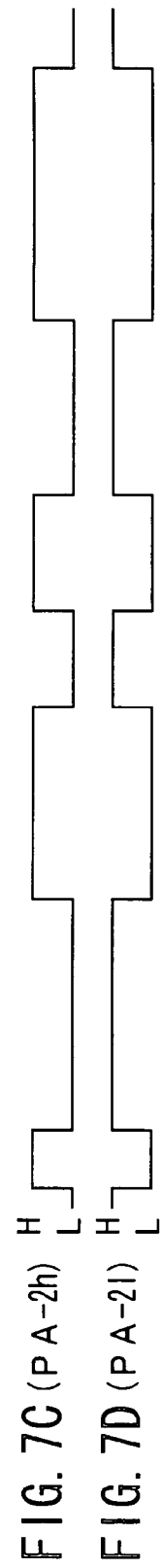
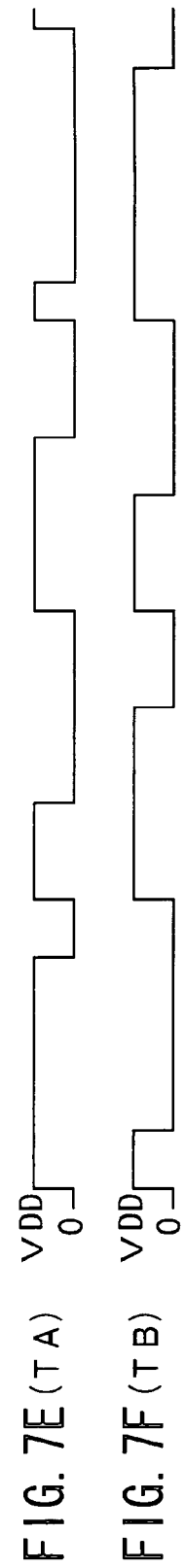
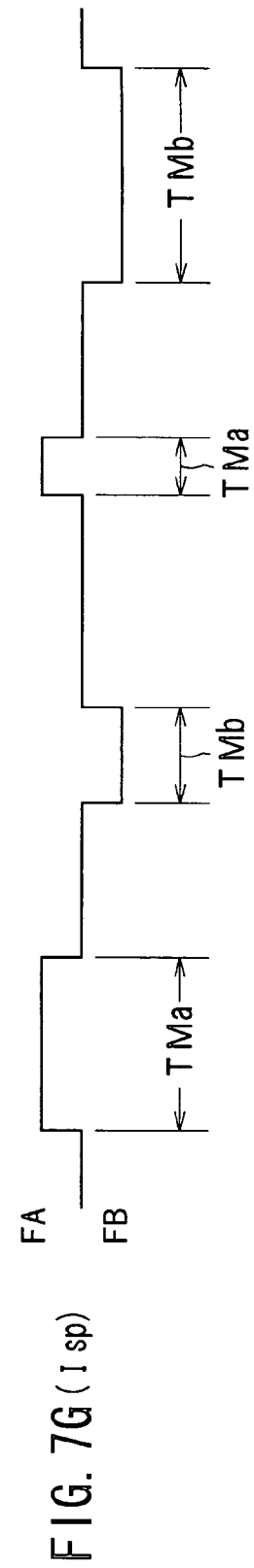

CLASS-D AMPLIFIER

CROSS REFERENCE TO RELATED APPLICATION

The present invention contains subject matter related to Japanese Patent Application No. 2004-210410 filed in the Japanese Patent Office on Jul. 16, 2004, the entire contents of which being incorporated herein by reference.

BACKGROUND OF THE INVENTION

1. Field of the Invention

The present invention relates to a class-D amplifier for audio application.

2. Description of the Related Art

An audio instrument uses a class-D amplifier widely for resulting in a rise in efficiency, downsizing it and saving the weight thereof. Japanese Patent Application Publication No. 2002-204149 discloses that the class-D amplifier includes a half-bridge switching amplifying unit composed of a pair of switching elements or a full-bridge switching amplifying unit composed of two pairs of switching elements and a driver unit for driving the switching amplifying unit. The driver unit receives a pulse width modulation (PWM) signal that is obtained by pulse-width-modulating an analog signal or a PWM signal containing a signal that is obtained by performing single-bit A/D conversion on an analog signal. The driver unit controls one of the switching elements paired in the switching amplifying unit so that it can be switched on or off at same phase as that of the received PWM signal. The driver unit also controls the other switching element so that it can be switched on or off at a phase opposite to that of the received PWM signal. A switching signal that is pulse-amplified by such the switching on or off of the switching elements is band-limited using a low pass filter, thereby realizing an amplified analog signal.

When driving the paired switching elements based on driving signals from the driver unit, if the switching elements of hi-side and low-side are switched on at the same time, a large shoot-through current may occur, thereby causing excessive heat to generate and/or such the element to be broken down therefor. Thus, in a class-D amplifier, a dead-time setting unit is provided to delay a timing for switching a switching element on so that the large shoot-through current may be prevented from being flown therethrough by setting the dead time that the switching elements of hi-side and low-side are switched off at the same time. If, however, the dead time is too long, a reproduced audio output from a speaker may be distorted seriously, thereby degrading audio quality. Therefore, a period of time for the dead time is so designed that a trade-off of an occurrence of the shoot-through current and an audio quality can be achieved.

SUMMARY OF THE INVENTION

Dead-time-setting unit sets a dead time by delaying a signal using an integrator composed of, for example, a capacitor and a resistor. FIG. 1 shows a configuration of dead-time-setting unit 90 relative to related art. Input signal Din is supplied to one input terminal of two-inputs AND gate 91 and one terminal of a resistor 92. The other terminal of the resistor 92 is grounded through a capacitor 93. The other terminal of the AND gate 91 is connected to a connection point P between the resistor 92 and the capacitor 93.

FIG. 2 illustrates operations of the dead-time-setting unit 90 relative to related art. FIG. 2A illustrates an input signal Din that is supplied to the dead-time-setting unit 90. FIG. 2B illustrates a level of signal Dp in the connection point P. FIG. 2C illustrates an output signal Dout that is output from the AND gate 91.

At a point of time t11 when the input signal Din reaches a high level H thereof, a level of the signal Dp in the connection point P is raised with a time constant determined by resistance of the resistor 92 and capacitance of the capacity 93.

At a point of time t12 when the level of the signal Dp excesses a threshold value Vth of the AND gate 91, both input signals that are supplied to the AND gate 91 become their high level H. Thus, the output signal Dout output from the AND gate 91 changes from its low level L to its high level H.

At a point of time t13 when the input signal Din falls down to its low level L, any one of the input signals that are supplied to the AND gate 91 becomes its low level. Thus, the output signal Dout output from the AND gate 91 changes from its high level H to its low level L. Such the configuration that any one of the input signals that are supplied to the AND gate 91 can be integrated using the resistor 92 and the capacity 93 allows the dead-time-setting unit 90 to delay a timing of raising edge in the input signal Din from the point of time t11 to the point of time t12.

If using such the configuration, however, when resistance of the resistor 92 and capacitance of the capacity 93 get distorted and their temperature variations occur, the dead time thereof may be away from a desired value of the dead time.

Further, as related art disclosed in the above Japanese Patent Application Publication No. 2002-204149, when temperature variations occur if electric voltage to be supplied to an inverter unit can be controlled according to the temperature variations in order to switch the switching elements on or off with high fidelity relative to the input signal, this may cause a configuration of the power unit to be made complex.

Additionally, in related art disclosed in the above Japanese Patent Application Publication No. 2002-204149, a range of timing adjustment for switching the element on or off is determined under variable range of the voltage to be supplied to the inverter unit. It is difficult to set the range of timing adjustment unrestrainedly.

In view of the above, there is a necessary for providing a class-D amplifier having an excellent audio quality by preventing excessive heat from generating in the switching elements and this element from being broken down based on the excessive heat generation.

According to an embodiment of the present invention, there is provided a class-D amplifier. The class-D amplifier has a switching amplifying-unit, which includes a pair of switching elements. The unit drives the switching elements and generates pulse-amplified switching signals. The amplifier also has a signal-generating unit, which generates pulse width modulation signals each for driving the switching elements and supplies the generated pulse width modulation signals to the switching amplifying-unit.

The switching amplifying unit includes a detecting sub-unit, which detects an operating state of the switching elements. The signal-generating unit includes a dead-time-setting sub-unit, which sets dead time relative to the switching elements by delaying each of the pulse width modulation signals using propagation delay time in logic devices. The signal-generating unit also includes a control sub-unit, which controls the dead-time-setting sub-unit based on a detected result of the detecting sub-unit to change the dead time based on the operating state of the switching elements.

In embodiments of this invention, as an operating state of the switching elements, temperatures of the switching elements or electric current flown through them are detected. When the switching elements are entered into an operating state where losses in the switching elements are increased and the detected result reaches a predetermined threshold value, namely, the temperatures of the switching elements rise up or electric current flown through them is increased to reach the threshold value thereof, a program for elongating propagation delay time in a logic device is produced or a delay circuit having long propagation delay time is selected, to elongate the dead time. Alternatively, when the switching elements are entered into an operating state where losses in the switching elements are decreased and the detected result reaches a predetermined threshold value, namely, the temperatures of the switching elements fall down or electric current flown through them is decreased, to reach the threshold value, a program for shortening propagation delay time in a logic device is produced or a delay circuit having short propagation delay time is selected, to shorten the dead time.

According to the embodiments of the present invention, utilizing the propagation delay time in a logic device to delay pulse width modulation signal allows the dead time to be set relative to the switching elements. This dead time is changed according to the operating state of the switching elements. Thus, by utilizing the propagation delay time in a logic device to set the dead time, little variations in the dead time may occur so that the dead time can be changed accurately according to the operating state of the switching elements.

According to the embodiments of the present invention, when the switching elements are entered into an operating state where losses in the switching elements are increased and the detected result reaches a predetermined threshold value, the dead time is elongated or when the switching elements are entered into an operating state where losses in the switching elements are decreased and the detected result reaches a predetermined threshold value, the dead time is shorten. When the temperature of the switching elements rise up, the dead time is elongated so that it can prevent excessive heat from generating in the switching elements and this element from being broken down based on the excessive heat generation. When the temperature of the switching elements is not raised, the dead time is shortened. This enables a class-D amplifier to have an excellent audio quality. Further, according to the embodiments of the invention, generation of heat in the switching elements is controlled to a low level thereof, thereby avoiding a heat sink or making a size thereof smaller. This enables an inexpensive class D amplifier to be provided.

According to the embodiments of the invention, it is possible to change the dead time by setting the dead time using programmable logic device, producing a program according to an operating state of the switching elements, and controlling the programmable logic device. This allows the dead time to be unrestrainedly changed.

According to the embodiments of the invention, plural delay circuits each having separate propagation delay time, each of which contains the logic device, are provided and any one of the delay circuits is selected based on the operating state of the switching elements, thereby changing the dead time. This allows the dead time to be easily changed.

The concluding portion of this specification particularly points out and directly claims the subject matter of the present invention. However those skill in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS

FIG. 1 is a block diagram for illustrating a configuration of dead-time-setting unit of related art;

FIGS. 2A through 2C are graphs each for explaining operations of the dead-time-setting unit of related art;

FIGS. 7A through 7G are graphs each for explaining operations of an embodiment of the class-D amplifier according to the invention;

DESCRIPTION OF THE PREFERRED EMBODIMENTS

The following will describe embodiments of a class-D amplifier according to the present invention with reference to drawings.

Figure 3:
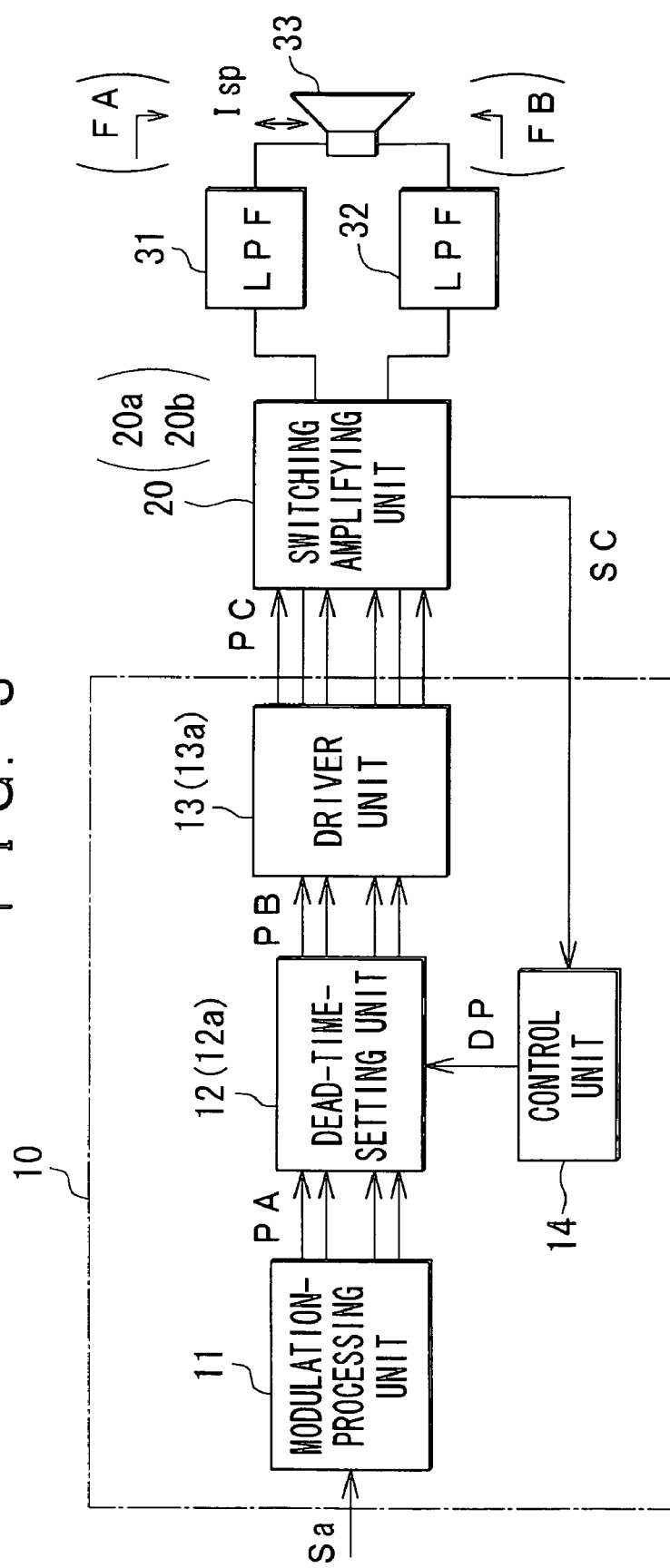
FIG. 3 is a block diagram for illustrating a configuration of an embodiment of class-D amplifier according to the invention.

FIG. 3 is a block diagram for illustrating a configuration of an embodiment of class-D amplifier according to the invention. It is to be noted that in FIG. 3, a switching amplifying unit 20 is a full-bridge switching amplifying-unit composed of two pairs of switching elements.

A modulation-processing unit 11 in a signal generation portion receives an analog audio signal Sa, generates pulse width modulation (PWM) signals PA based on the signal Sa, and supplies them to a dead-time-setting unit 12. For example, a comparator compares amplitude of the audio signal Sa with that of a triangle wave to convert the audio signal Sa to a binary form so that the PWM signal can be generated and supplied to the dead-time-setting unit 12. Such the generation of PWM signal may be made using a delta-sigma modulation scheme. In the delta-sigma modulation scheme, an analog audio signal Sa is input to an integrator and an output from the integrator is converted to a digital signal by A-D conversion, thereby generating a bit-stream signal. The bit-stream signal thus generated is converted to an analog signal by D-A conversion and the analog signal thus converted is supplied to the integrator in which it is fed back negatively, thereby generating a bit-stream signal according to the audio signal Sa. The bit-stream signal thus generated has a bit spacing based on a signal level of the audio signal Sa. PWM signals are then generated based on this bit stream signal and supplied to the dead-time-setting unit 12. The modulation-processing unit 11 may generate PWM signals based on digital audio signal and supply them to the dead-time-setting unit 12. In this case, the modulation-processing unit 11 delta-sigma-modulates the received digital audio signal and then pulse-width-modulates it to generate the PWM signals.

The dead-time-setting unit 12 adjusts timings of the PWM signals PA-1$h$, PA-1$l$, PA-2$h$, and PA-2$l$, which have been generated in the modulation-processing unit 11, to set the dead time when both of a switching element of high side and a switching element of low side are switched off at the same time.

Figure 4:
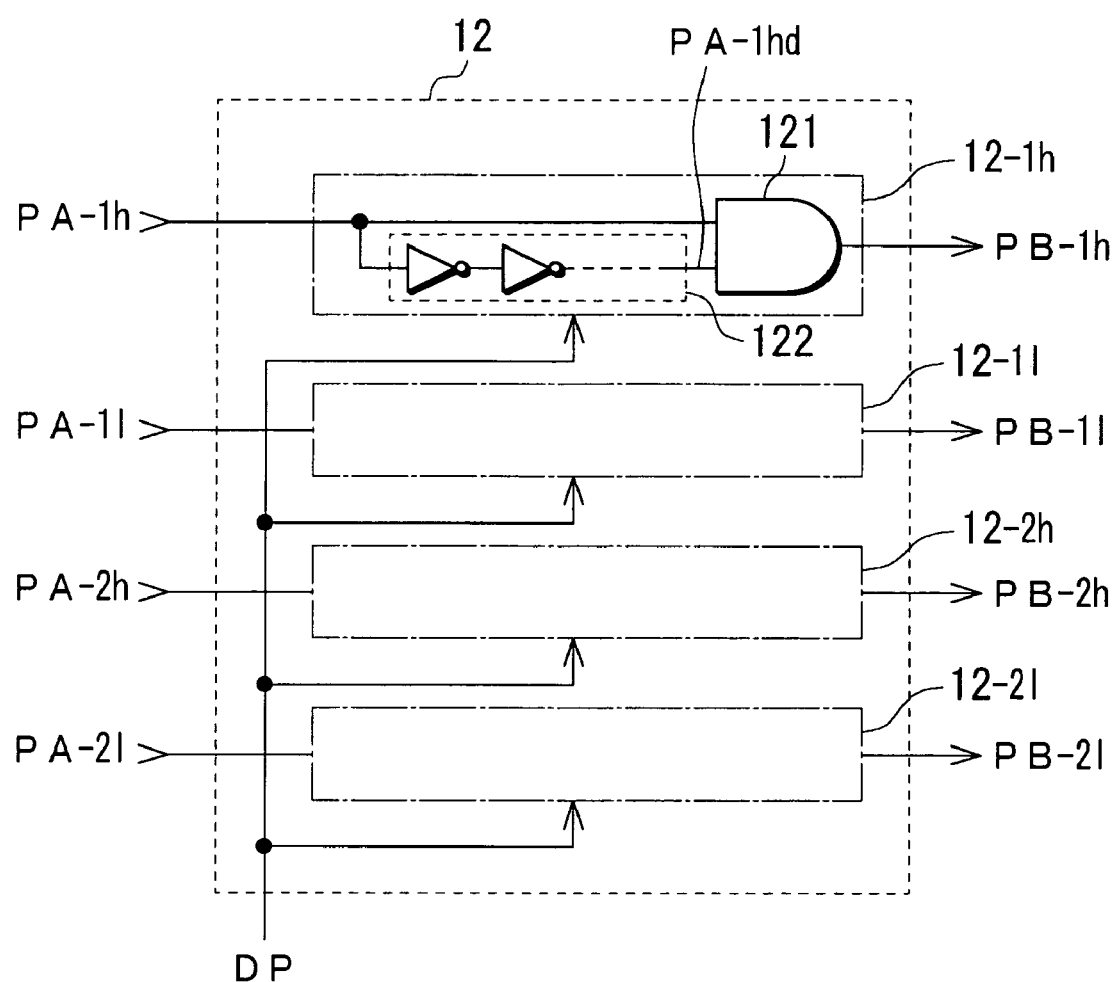
FIG. 4 is a diagram for illustrating a configuration of dead-time-setting unit used in an embodiment of class-D amplifier according to the invention.

FIG. 4 illustrates a configuration of the dead-time-setting unit 12. The dead-time-setting unit 12 is composed of programmable hardware logic device, for example, programmable logic device (PLD). In the dead-time-setting unit 12, timing adjustment circuits 12-1$h$, 12-1$l$, 12-2$h$, and 12-2$l$ each having the same circuit configuration are provided for each PWM signal which has been generated in the modulation-processing unit 11.

The timing adjustment circuit 12-1$h$ receives the PWM signal PA-1$h$. In circuit 12-1$h$, AND gate 121 then receives the signal PA-1$h$ at its one input terminal. A delay-generating circuit 122 also receives the signal PA-1$h$. The delay-generating circuit 122 is constituted of a series of logic devices, each of which is connected in serial on the basis of dead time control information DP received from a control unit 14. The delay-generating circuit 122 generates a PWM signal PA-1$hd$, which has a set amount of delay relative to the PWM signal PA-1$h$, and supplies it to the other input terminal of the AND gate 121. In this configuration, when the logic devices are connected in serial, propagation delay time for each logic device is accumulated. Thus, the delay-generating circuit 122 can generate the PWM signal PA-1$hd$ accurately, which has a set amount of delay relative to the PWM signal PA-1$h$. It is to be noted that as the logic device, a gate, a flip-flop and the like can be used therefor and that in FIG. 4, in the delay-generating circuit 122, one or more pairs of inverters are connected in serial. In a case where using PLD, it is possible to supply the dead time control information DP easily by using an interface such as joint test action group (JTAG).

The AND gate 121 receives two signals, PA-1$h$ and PA-1$hd$, and generates a logic AND signal of these received two signals as PWM signal PB-1$h$ to supply it to the driver unit 13. The PWM signal PA-1$hd$ has a set amount of delay relative to the PWM signal PA-1$h$ so that this logic AND signal can have an accurately set amount of delay relative to timing of a raising edge of a pulse in the PWM signal PA-1$h$. In other words, a timing when a switching element is switched on can be delayed by the accurately set amount of delay. Thus, the logic AND signal generated in the timing adjustment circuit 12-1$h$ is supplied to the driver unit 13 as the PWM signal PB-1$h$.

As the timing adjustment circuit 12-1$h$, each of the timing adjustment circuits 12-1$l$, 12-2$h$, and 12-2$l$ generates a signal that is delayed by the accurately set amount of delay relative to a timing of a raising edge of a pulse in each of the PWM signals PA-1$l$, PA-2$h$, and PA-2$l$ and supply each of the signals to the driver unit 13 as each of the PWM signals PB-1$l$, PB-2$h$, and PB-2$l$. Thus, the PWM signals PB-1$h$, PB-1$l$, PB-2$h$, and PB-2$l$ generated in the dead-time-setting unit 12 respectively have an accurately set amount of delay relative to a timing of a raising edge of a pulse in each of the PWM signals PA-1$h$, PA-1$l$, PA-2$h$, and PA-2$l$. This enables to be accurately set the dead time when both of a switching element of high side and a switching element of low side are switched off at the same time. Controlling a logic device to be used in the delay-generating circuit 122 and the numbers of the serially connected logic devices therein allows a period of the dead time to be changed.

The driver unit 13 shown in FIG. 3 generates driving signals PC-1$h$, PC-1$l$, PC-2$h$, and PC-2$l$ each driving the switching amplifying unit 20 based on the PWM signals PB-1$h$, PB-1$l$, PB-2$h$, and PB-2$l$, respectively, which are received from the dead-time-setting unit 12.

Figure 5:
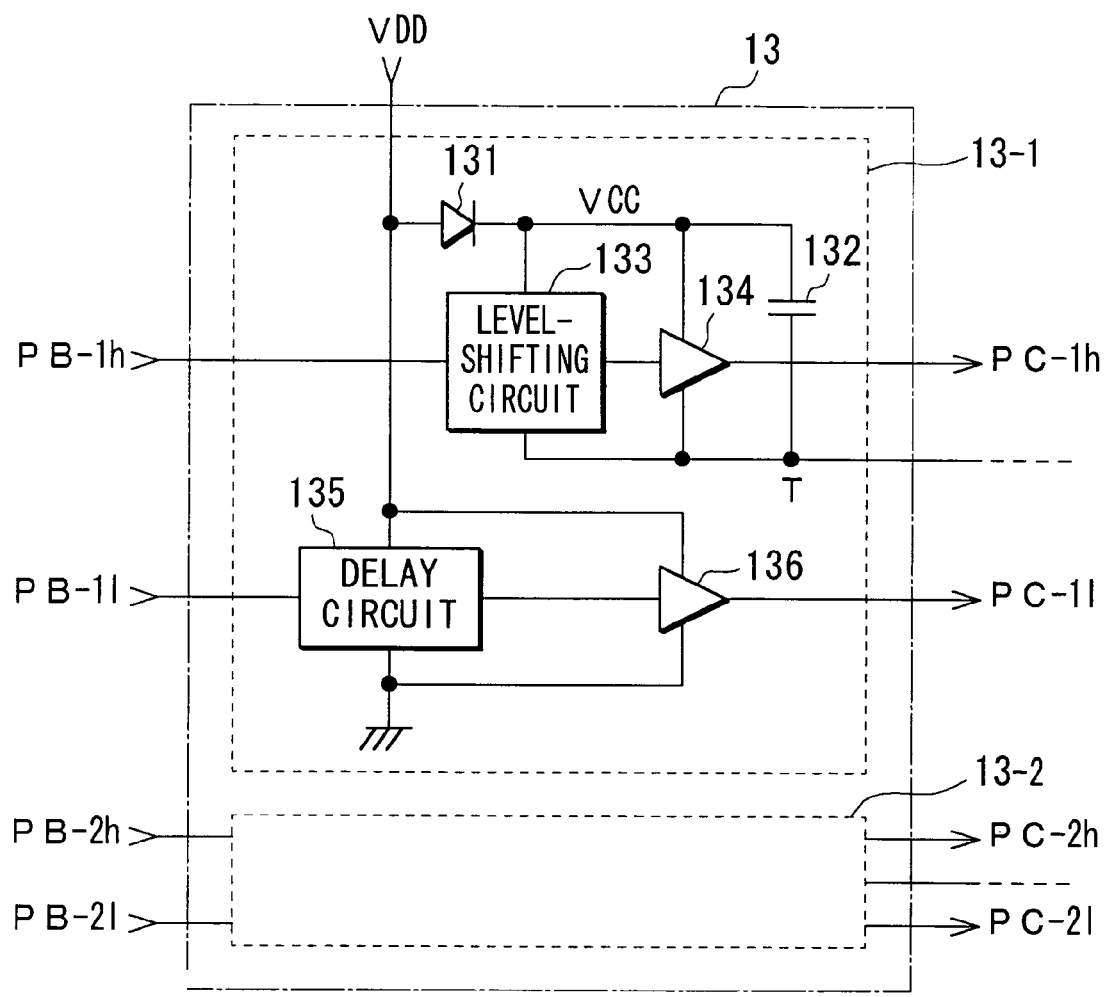
FIG. 5 is a diagram for illustrating a configuration of driver unit used in an embodiment of class-D amplifier according to the invention.

FIG. 5 illustrates a configuration of the driver unit 13 when the switching amplifying unit 20 is constituted of N-channel MOSFET.

The driver unit 13 has a first driver sub-unit 13-1 for driving signals PC-1$h$ and PC-1$l$ based on the PWM signals PB-1$h$ and PB-1$l$ and a second driver sub-unit 13-2 for driving signals PC-2$h$ and PC-2$l$ based on the PWM signals PB-2$h$ and PB-2$l$. The second driver sub-unit 13-2 has the same configuration as that of the first driver sub-unit 13-1.

In the first driver sub-unit 13-1, power voltage VDD is applied to anode of a diode 131, a delay circuit 135, and an amplifier portion 136, respectively. Cathode of the diode 131 is connected with a terminal of a capacitor 132, a level-shifting circuit 133, and an amplifier portion 134. The other terminal of the capacitor 132 is connected with connection point T, which will be described later. With the connection point T, the level-shifting circuit 133 and the amplifier portion 134 are connected.

The diode 131 and the capacitor 132 constitute a bootstrap circuit. The bootstrap circuit enables a power voltage VCC that is applied to the level-shifting circuit 133 and the amplifier portion 134 to be made higher than the power voltage VDD. In the embodiment, N-channel MOSFET is used as a switching element of high side. If the power voltage VBB is applied to a drain of the N-channel MOSFET of high side, a gate is necessary for being driven at a voltage higher than that of the connection point T by at least gate threshold voltage GS in order to switch the N-channel MOSFET on accurately. Since a voltage of the connection point T varies based on a driving state of another MOSFET, the power voltage VCC is made higher than the power voltage VBB applied to a drain of N-channel MOSFET of high side by at least gate threshold voltage GS, in order to switch N-channel MOSFET of high side on or off accurately with the amplifier portion 134 in spite of the driving state of another MOSFET.

The level-shifting circuit 133 receives the PWM signal PB-1$h$ and converts the PWM signal PB-1$h$ into a signal with a signal level of the PWM signal PB-1$h$ shifting to one corresponding to an input level of the amplifier portion 134. The delay circuit 135 receives the PWM signal PB-1$l$, delays it by a period of time that is necessary for shifting the signal level of the PWM signal PB-1$h$ in the level-shifting circuit 133, and supplies the delayed signal to the amplifier portion 136.

The amplifier portion 134 receives and amplifies the level-shifted PWM signal PB-1$h$ to generate a driving signal PC-1*h*, and supplies it to the switching amplifying unit 20. The amplifier portion 136 receives and amplifies the delayed PWM signal PB-1*l* to generate a driving signal PC-1*l*, and supplies it to the switching amplifying unit 20.

As the first driver sub-unit 13-1, the second driver sub-unit 13-2 generates driving signals PC-2*h* and PC-2*l* base on the PWM signals PB-2*h* and PB-2*l*, and supplies the driving signals to the switching amplifying unit 20.

The control unit 14 generates dead time control information DP based on a sensor signal SC from the switching amplifying unit 20 and supplies it to the dead-time-setting unit 12 in which the dead time can change according to operating states of MOSFETs 201, 202, 203, and 204, which will be described later.

Figure 6:
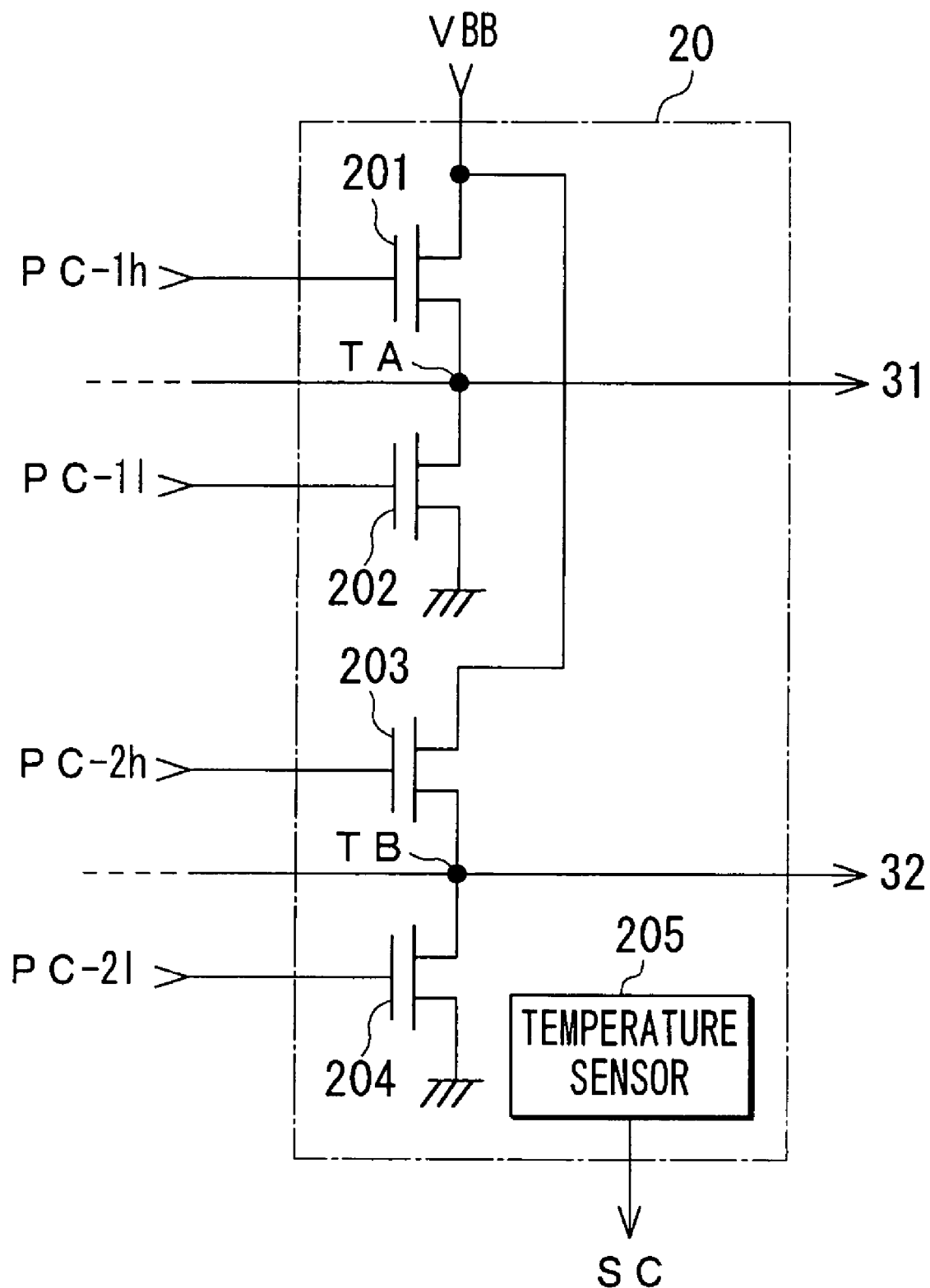
FIG. 6 is a diagram for illustrating a configuration of switching amplifying unit used in an embodiment of class-D amplifier according to the invention.

FIG. 6 illustrates a configuration of the switching amplifying unit 20. The switching amplifying unit 20 includes N-channel MOSFETs in which MOSFETs 201 and 202 is paired and MOSFETs 203 and 204 is also paired. Thus, the switching amplifying unit 20 has a full-bridge configuration.

Power voltage VBB is applied to drains of MOSFETs 201 and 203. A source of the MOSFET 201 is connected with a drain of the MOSFET 202. A source of the MOSFET 202 is grounded. Similarly, a source of the MOSFET 203 is connected with a drain of the MOSFET 204. A source of the MOSFET 204 is grounded. The driver unit 13 supplies the driving signal PC-1*h* to a gate of the MOSFET 201. The driver unit 13 also supplies the driving signals PC-1*l*, PC-2*h*, and PC-2*l* to gates of the MOSFETs 202, 203, 204, respectively.

A connection point TA between the source of the MOSFET 201 and the drain of the MOSFET 202 is connected with an input terminal of a speaker 23 via a low pass filter 31. A connection point TB between the source of the MOSFET 203 and the drain of the MOSFET 204 is connected with the other input terminal of the speaker 23 via a low pass filter 32.

The switching amplifying unit 20 has a detecting unit for detecting any of the operating states of the switching elements. For example, as the detecting unit, temperature sensor 205 such as thermistor and thermocouple is provided therein. The temperature sensor 205 detects temperature of any of the switching elements varying according to losses in the switching elements, generates the sensor signal SC indicating a result of the detection and supplies it to the control unit 14.

FIGS. 7A through 7G are graphs each for explaining operations of an embodiment of the class-D amplifier according to the invention. FIGS. 7A through 7D show the PWM signals PA-1*h*, PA-1*l*, PA-2*h*, and PA-2*l*, respectively, generated in the modulation-processing unit 11. As described above, the PWM signal PA-1*h* is used for driving MOSFET 201 of high side. The PWM signal PA-1*l* is used for driving MOSFET 202 of low side. The PWM signal PA-2*h* is used for driving MOSFET 203 of high side. The PWM signal PA-2*l* is used for driving MOSFET 204 of low side.

FIG. 7E shows a voltage of the connection point TA. FIG. 7F shows a voltage of the connection point TB. If the PWM signal indicates high level H, MOSFET is switched on. If the PWM signal indicates low level L, MOSFET is switched off. During a period of time TMa when MOSFETs 201 and 204 are switched on as well as MOSFETs 202 and 203 are switched off, a direction ISP of a current flown through the speaker 23 becomes a direction FA that a current flows from the low pass filter 31 to the low pass filter 32 via the speaker 23. On the other hands, during a period of time TMb when MOSFETs 201 and 204 are switched off as well as MOSFETs 202 and 203 are switched on, the direction ISP becomes a direction FB that a current flows from the low pass filter 32 to the low pass filter 31 via the speaker 23.

Figure 8:
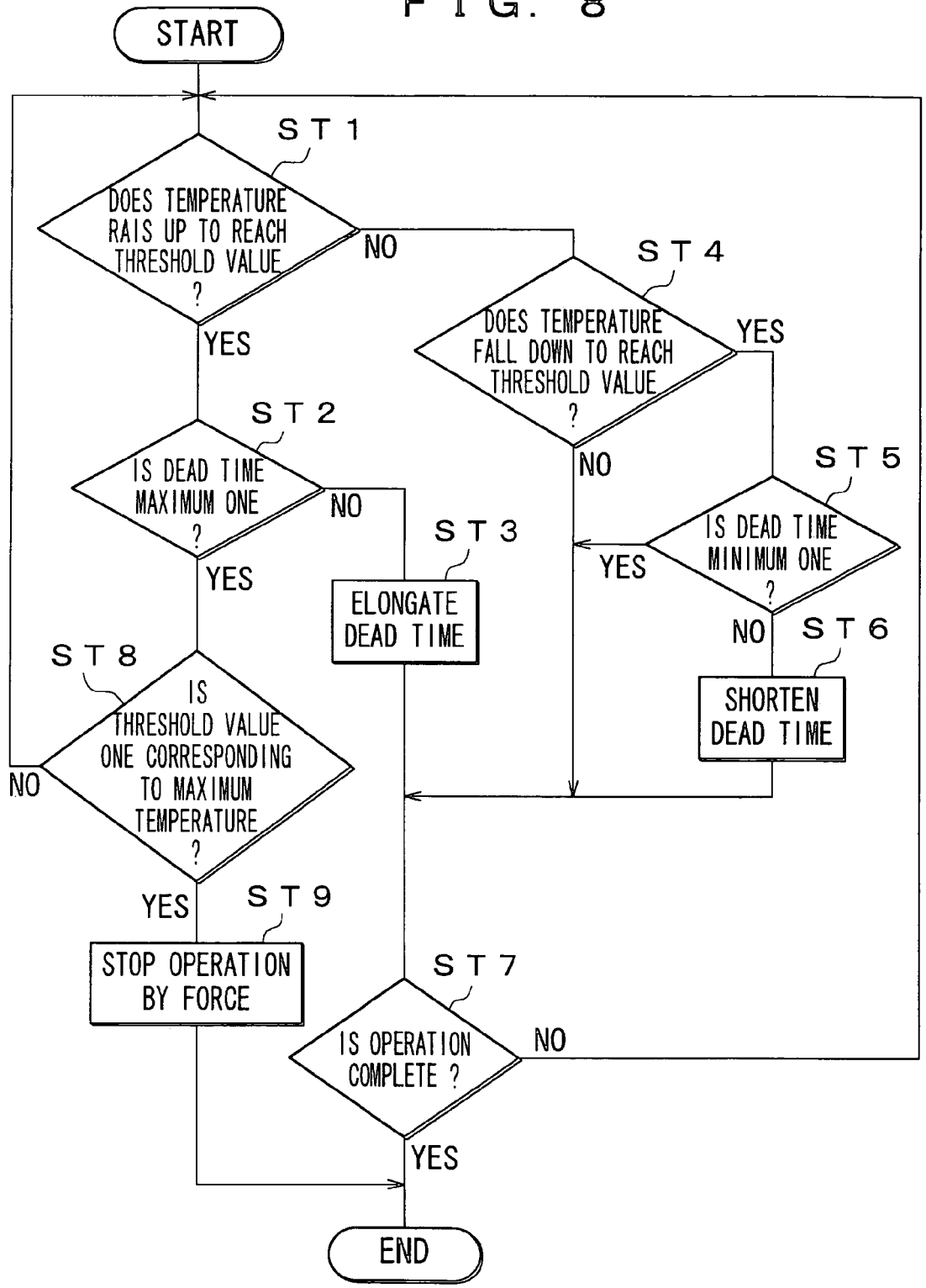
FIG. 8 is a flowchart for showing control operations of the dead time in an embodiment of the class-D amplifier according to the invention.

FIG. 8 is a flowchart for showing control operations of the dead time in the control unit 14. At Step ST1, the control unit 14 determines whether or not temperature in the switching amplifying unit 20 rises up to reach a threshold value based on the sensor signal SC from the temperature sensor 205. If reaching the threshold value, the process goes to a step ST2. If not, the process goes to a step ST4.

At step ST2, the control unit 14 determines whether or not the current dead time is maximum one. Since a timing when a switching element is switched on is delayed when the dead time is set, as described above, a large distortion may occur when the dead time is too long. Thus, the dead time that is an allowable maximum distortion value is set as maximum dead time. It is determined whether or not the current dead time is the maximum dead time.

If the current dead time is not the maximum dead time, the process goes to a step ST3. At step ST3, the dead-time-setting unit 12 is controlled so as to elongate the dead time and the process goes to a step ST7. For example, numbers of the serially connected logic devices is increased, thereby elongating the dead time. If the current dead time is the maximum dead time, the process goes to a step ST8.

When the process goes from the step ST1 to the step ST4 wherein the control unit 14 determines whether or not temperature in the switching amplifying unit 20 falls down to reach a threshold value based on the sensor signal SC from the temperature sensor 205. If reaching the threshold value, the process goes to a step ST5. If not, the process goes to a step ST7.

At step ST5, the control unit 14 determines whether or not the current dead time is minimum one. If the current dead time is not the minimum dead time, the process goes to a step ST6. At step STT6, the dead-time-setting unit 12 is controlled so as to shorten the dead time and the process goes to a step ST7. For example, numbers of the serially connected logic devices is decreased, thereby shortening the dead time. If the current dead time is the minimum dead time, the process goes to a step ST7.

At step ST7, it is determined whether or not the operation of class-D amplifier is complete. If any manipulation for completing the operation is performed to finish the oration of class-D amplifier, the control operation is complete. If the operation of class-D amplifier is incomplete, the process goes back to the step ST1.

When it is determined that the current dead time is maximum one at step ST2 and the process goes to the step ST8, the control unit 14 determines whether or not the threshold value, which has been determined at the step ST1, that the temperature reaches is one corresponding to the maximum temperature. If the threshold value is not one corresponding to the maximum temperature, the process goes back to the step ST1. If so, the process goes to the step ST9.

At step ST9, the control unit 14 forcibly stops the operation of the switching element to prevent any switching element from being broken down on the basis of excessive heat generation because the temperature in the switching amplifying unit 20 has already reached the allowable maximum temperature and thus, the dead time ceases to be further elongated. For example, in doing so, the driving signals PC-1*h*, PC-1*l*, PC-2*h*, and PC-2*l* are generated so that all the MOSFETs 201, 202, 203, and 204 are switched off. Alternatively, the application of power voltage VBB to the switching element is stopped.

Figure 9A:
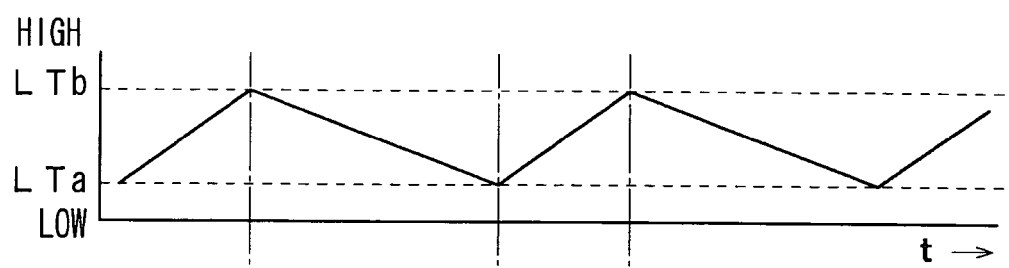
FIGS. 9A and 9B are graphs each for explaining the control operations of the dead time thereof.
Figure 9B:
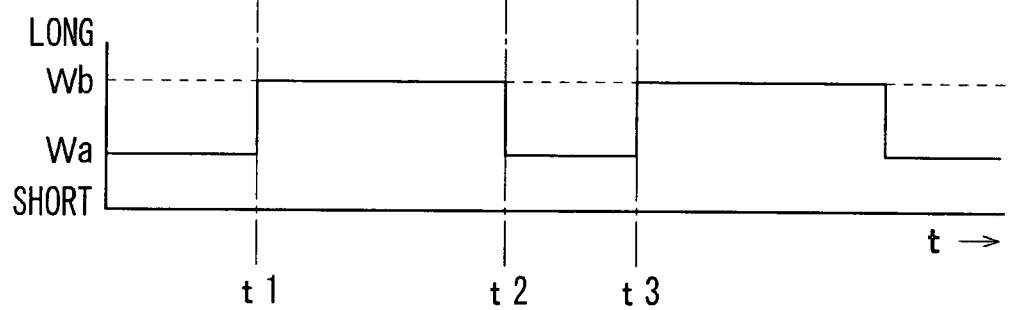

FIGS. 9A and 9B are graphs each for explaining the control operations of the dead time. FIG. 9A shows temperature in the switching amplifying unit 20. FIG. 9B shows the dead time.

When, after starting the operation of class-D amplifier, temperature in the switching amplifying unit 20 rises up to reach a threshold value LTb at a point of time t1, as shown in FIG. 9A, the control unit 14 controls the dead-time setting unit 12 to elongate the dead time from Wa to Wb, as shown in FIG. 9B. The elongation of the dead time causes the heat generation in the switching amplifying unit to be decreased, thereby falling down the temperature therein. When the temperature reaches a threshold value LTa at a point of time t2, the control unit 14 controls the dead-time setting unit 12 to shorten the dead time from Wb to Wa, as shown in FIG. 9B. Thereafter, the temperature in the switching amplifying unit 20 rises up again to reach the threshold value LTb at a point of time t3, the control unit 14 controls the dead-time setting unit 12 to elongate the dead time from Wa to Wb. Similarly, the dead time is adjusted according to the temperatures in the switching amplifying unit 20. It is to be noted that if further increased threshold values are set, it is possible to control the dead time more in detail.

Thus, in the signal generation portion 10, by delaying the PWM signals using the propagation delay time for logic devices, the dead time may be set relative to the switching elements. The dead time can vary according to the temperatures in the switching amplifying unit 20. This allows less variations in the dead time to be realized, thereby enabling the dead time to vary accurately according to the temperatures in the switching amplifying unit 20.

In the embodiment of class-D amplifier of this invention, the dead time is elongated every time when the temperature in the switching amplifying unit 20 rises up to reach a threshold value and the dead time is shortened every time when the temperature in the switching amplifying unit 20 falls down to reach a threshold value. This prevents excessive heat from generating in the switching elements and the element from being broken down on the basis of the excessive heat generation. If the temperature in the switching amplifying unit 20 falls down, the dead time is shortened, so that it is possible to decrease distortion in reproduced audio signal to obtain excellent audio quality. The embodiments of class-D amplifier of this invention allows for controlling the dead time to restrict generation of heat in each of the MOSFETs 201, 202, 203, and 204 to a low level thereof, thereby avoiding a heat sink to be attached to the MOSFETs 201, 202, 203, and 204 or making their size smaller. This enables an inexpensive class D amplifier to be provided. According to the embodiment of class-D amplifier of the invention, it is possible to change the dead time unrestrainedly during the amplifier operation by setting the dead time using programmable logic device, producing a program according to operating states of the switching elements, and controlling the programmable logic device.

Although the dead-time-setting unit has been composed of the programmable logic device in the above embodiments, this invention is not limited to this.

Figure 10:
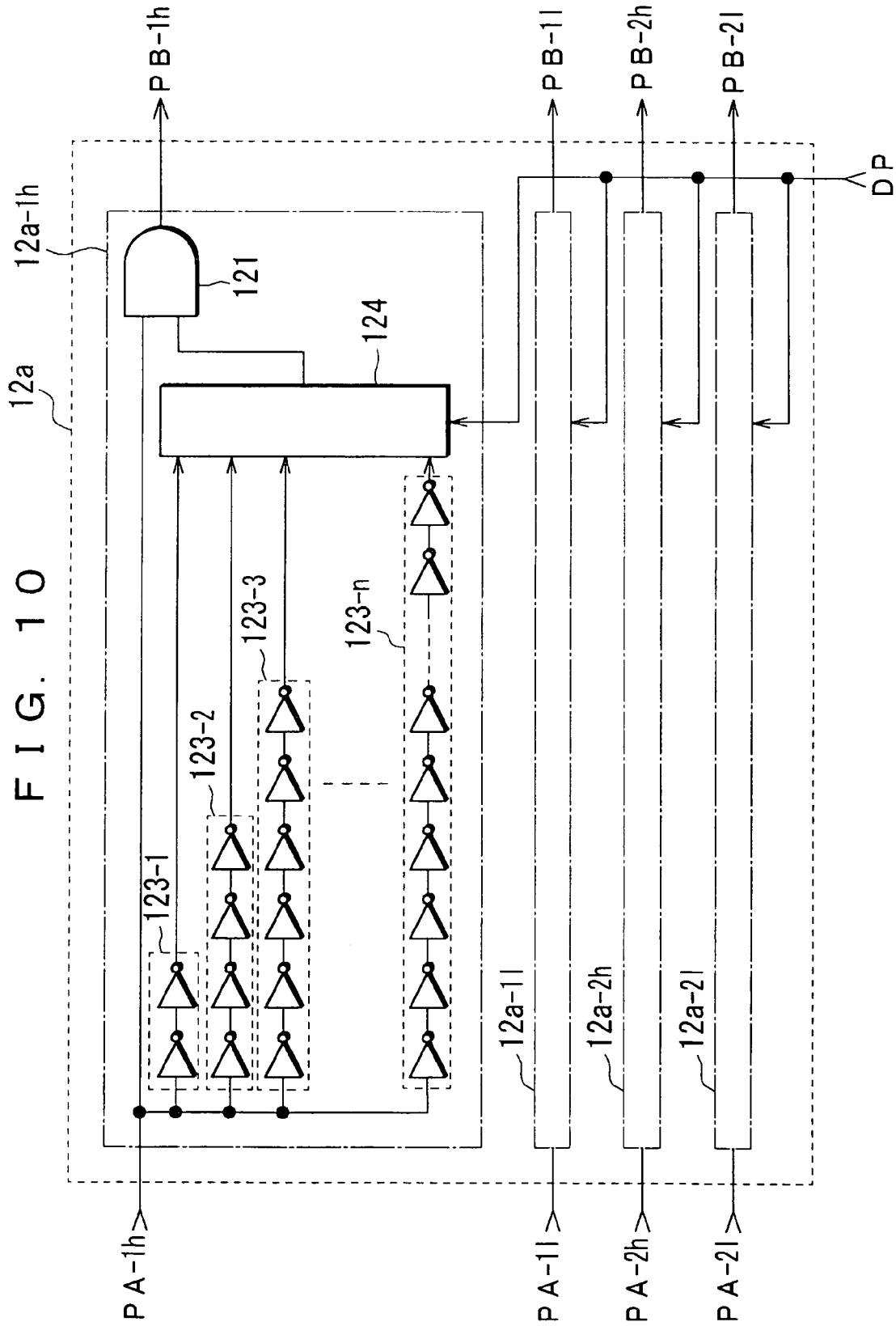
FIG. 10 is a diagram for illustrating a configuration of another embodiment of dead-time-setting unit.

FIG. 10 illustrates a configuration of another embodiment of dead-time-setting unit 12a. In the dead-time-setting unit 12a, timing adjustment circuits 12a-1h, 12a-1l, 12a-2h, and 12a-2l, which have the same circuit configuration as each other, are provided for every PWM signal generated in the modulation-processing unit 11.

The timing adjustment circuit 12a-1h has plural delay generation circuits 123-1 through 123-n in each of which a variety of numbers of serially connected delay elements is provided. Each delay element is composed of a pair of inverters, for example. The timing adjustment circuit 12a-1h receives PWM signal PA-1h. The PWM signal PA-1h is supply to an input terminal of AND gate 121 and the plural delay generation circuits 123-1 through 123-n. The delay generation circuits 123-1 through 123-n respectively delay the received PWM signal PA-1h by separate amount of delay to supply the delayed PWM signal PA-1h to a signal selection portion 124. The signal selection portion 124 selects one of the delay generation circuits 123-1 through 123-n based on the dead time control information DP that is received from the control unit 14. The signal selection portion 124 then supplies a signal, which has been received from the selected delay generation circuit, to the AND gate 121. The AND gate 121 generates a logical AND signal between the received two signals as the PWM signal PB-1h to supply it to the driver unit 13.

As the timing adjustment circuit 12a-1h, each of the timing adjustment circuits 12a-1l, 12a-2h, and 12a-2l generates a signal in which a timing of a rising edge of a pulse in each of the PWM signals PA-1l, PA-2h, and PA-2l is accurately delayed by a set amount of delay thereof to supply it to the driver unit 13 as the PWM signals PB-1l, PB-2h, and PB-2l, respectively.

The control unit 14 then changes over these delay generation circuits 123-1 through 123-n every time when the temperature in the switching amplifying unit 20 rises up to reach a threshold value and elongates the dead time. Alternatively, the control unit 14 changes over these delay generation circuits 123-1 through 123-n every time when the temperature in the switching amplifying unit 20 falls down to reach a threshold value and shortens the dead time. Thus, selection of the delay generation circuit according to the temperatures in the switching amplifying unit 20 to use a signal output from the selected delay generation circuit allows the dead time to vary easily.

Figure 11:
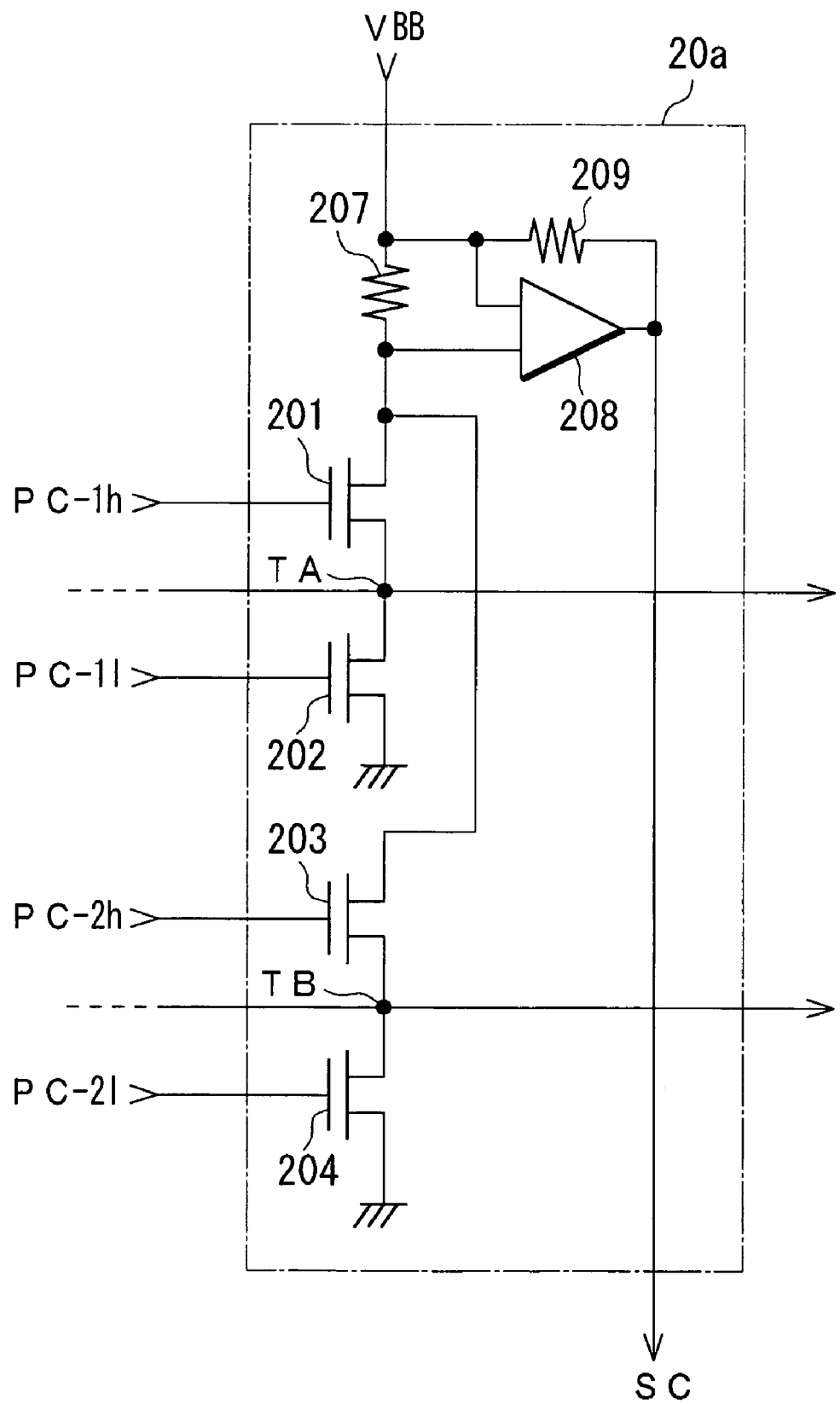
FIG. 11 is a diagram for illustrating a configuration of another embodiment of the switching amplifying unit.

Although, in the above embodiment, as the operating state of the switching elements, the temperature in the switching elements which vary based on the losses in the switching elements has been detected, this invention is not limited to this. Since the losses in the switching elements vary based on a current flown through the switching elements, the current flown through the switching elements may be detected as the operating state of the switching elements so that the dead time can vary based on a detection result thereof. FIG. 11 illustrates a configuration of another embodiment of the switching amplifying unit 20a when it detects a current flown through the switching elements.

Power voltage VBB is applied to drains of MOSFETs 201 and 203 via a resistor 207 for detecting a current. A terminal of the resistor 207 is connected with an inverting input terminal of operational amplifier 208 and the other terminal thereof is connected with non-inverting input terminal of the operational amplifier 208. A feedback resistor 209 is provided between an output terminal and the non-inverting input terminal of the operational amplifier 208. In this case, a voltage according to a current flown through MOSFETs 201 and 203 occurs between the terminals of the resistor 207, thereby causing an output signal from the operational amplifier 208 to correspond to the current flown through MOSFETs 201 and 203. Thus, the output signal from the operational amplifier 208 is supplied to the control unit 14 as the sensor signal SC. If a current indicated by the sensor signal SC exceeds a threshold thereof, the control unit 14 controls the dead-time-setting unit 12 to elongate the dead time and if a current indicated by the sensor signal SC falls down a threshold thereof, the control unit 14 controls the dead-time-setting unit 12 to shorten the dead time. Thus, controlling the dead time based on the current flown through the switching element prevents an excessive heat from generating in any MOSFETs 201, 202, 203, and 204 and the MOSFETs 201, 202, 203, and 204 from being broken down on the basis of the excessive heat generation. Further this enables the class-D amplifier to obtain excellent audio quality. If currents flown through the MOSFET 201 and 203 are separately detected, the dead time relative to the MOSFETs 201 and 202 is controlled based on the current flown through the MOSFET 201, and the dead time relative to the MOSFETs 203 and 204 is controlled based on the current flown through the MOSFET 203. If so, it is possible to surely prevent excessive heat from generating therein and the element from being broken down based on the excessive heat generation, thereby obtaining further excellent audio quality.

The control unit 14 may be so configured that a period of another dead time when the dead time is prohibited from being changed over a set period of time after the dead time has been changed can be provided. In this case, if a current flown through the switching elements varies violently, the dead time is not necessary for being changed so very often based on the current flown therethrough, thereby obtaining an stable operation of the class-D amplifier.

Figure 12:
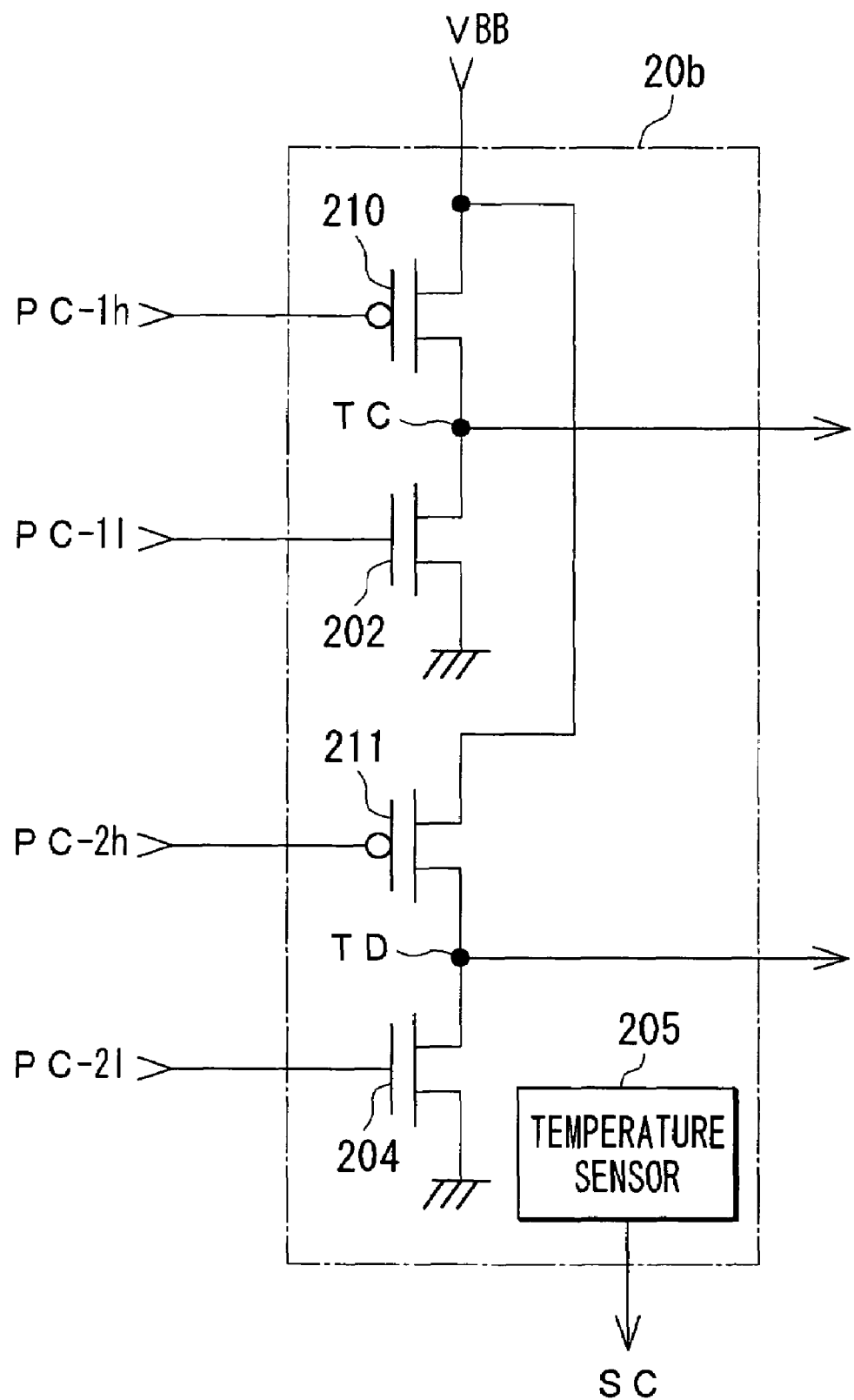
FIG. 12 is a diagram for illustrating a configuration of still another embodiment of the switching amplifying unit in which P-channel MOSFET is used at its high side.

Although the switching amplifying units 20 and 20*a* have been configured as full-bridge switching amplifying-unit using N-channel MOSFETs, this invention is not limited to this. In an embodiment of class-D amplifier of the invention, a switching amplifying-unit using P-channel MOSFETs may be configured. FIG. 12 illustrates a configuration of still another embodiment of the switching amplifying unit 20*b* in which P-channel MOSFET is used at its high side.

In this case, power voltage VBB is applied to sources of P-channel MOSFETs 210 and 211. A drain of the MOSFET 210 is connected with a drain of the MOSFET 202. A drain of the MOSFET 211 is also connected with a drain of the MOSFET 204.

A connection point TC between the drain of the MOSFET 202 and the drain of the MOSFET 210 is connected with an input terminal of a speaker 23 via a low pass filter 31. A connection point TD between the drain of the MOSFET 204 and the drain of the MOSFET 211 is connected with the other input terminal of the speaker 23 via a low pass filter 32.

Thus, if the P-channel MOSFET is used at its high side, the MOSFETs 210 and 211 can be accurately switched on or off when gate voltages of the MOSFETs 210 and 211 are not made higher than a voltage of the connection point TC. This avoids providing a driver unit 13*a* for supplying a driving signal to the switching amplifying unit 20*b* with any bootstrap circuit. This allows a configuration of the switching amplifying unit to be made simpler than that of a case where the N-channel MOSFET is used at its high side.

Figure 13:
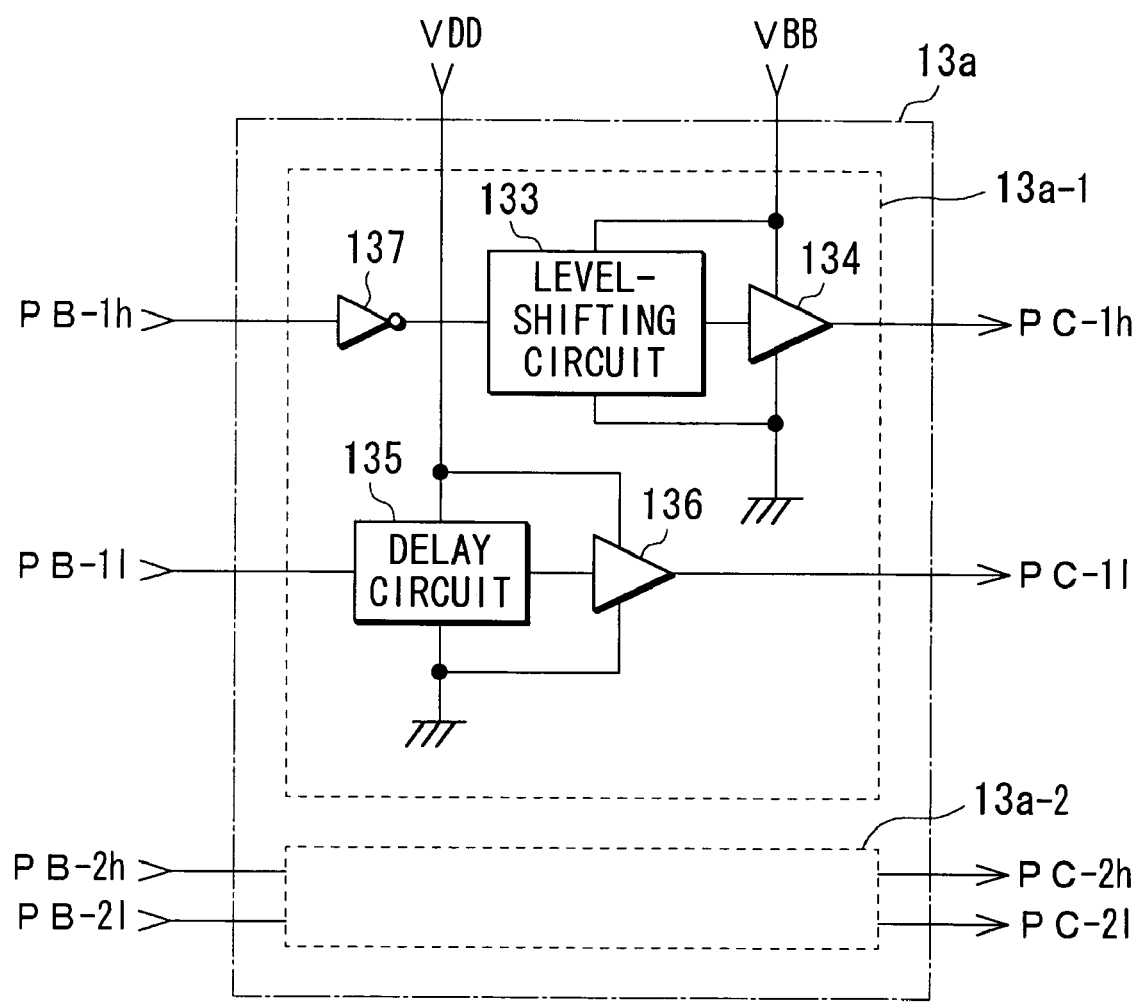
FIG. 13 is a diagram for illustrating a configuration of still another embodiment of the driver unit in which P-channel MOSFET is used at its high side.

FIG. 13 illustrates a configuration of still another embodiment of the driver unit 13*a* in which P-channel MOSFET is used at its high side. The driver unit 13*a* has a first driver sub-unit 13*a*-1 for driving signals PC-1*h* and PC-1*l* based on the PWM signals PB-1*h* and PB-1*l* and a second driver sub-unit 13*a*-2 for driving signals PC-2*h* and PC-2*l* based on the PWM signals PB-2*h* and PB-2*l*.

Since the P-channel MOSFET is used at its high side in this embodiment, on the first driver sub-unit 13*a*-1, an inverter 137 inverts the PWM signal PB-1*h* at its logic level to supply the inverted signal to the level-shifting circuit 133. Power voltage VBB that is the same as that applied in each of the cases of the switching amplifying units 20 and 20*a* is applied to the level-shifting circuit 133 and the amplifier portion 134. A delay circuit 135 when using the P-channel MOSFET at its high side delays the PWM signal PB-1*l* by an amount of time when propagation delay time in the inverter 137 and time necessary for shifting a signal level of the PWM signal PB-1*h* in the level-shifting circuit 133 are added and supplies it to an amplifier portion 136.

As the first driver sub-unit 13*a*-1, the second driver sub-unit 13*a*-2 generates the signals PC-2*h* and PC-2*l* based on the PWM signals PB-2*h* and PB-2*l* to them to the switching amplifying unit 20*b*.

Thus, if the P-channel MOSFET is used at its high side, the P-channel MOSFETs 210 and 211 can be switched on or off at the same timing as those of N-channel MOSFETs 201 and 203 when logic levels of the PWM signal PB-1*h* and PB-2*h* are inverted, or a desired logic inversion is carried out in the modulation-processing unit or the dead-time-processing unit to shift their level to generate the driving signal PC-1*h* and PC-2*h*. This allows the operations of the class-D amplifier that are the same as those shown in FIGS. 7A through 7G to be realized. This prevents excessive heat from generating in the switching element or the switching element from being broken down based on the excessive heat generation. This also allows an audio signal to be reproduced with less distortion, thereby obtaining excellent audio quality. Further, this allows a configuration of the driver unit to be made simpler.

Thus have been described the embodiments of class-D amplifier according to the invention. It should be understood by those skilled in the art that various modifications, combinations, sub-combinations and alternations may occur depending on design requirements and other factors insofar as they are within the scope of the appended claims or the equivalents thereof.

What is claimed is:

1. A class-D amplifier comprising:
   switching amplifying means including a pair of switching elements, said switching amplifying means driving the switching elements and generating pulse-amplified switching signals; and
   signal-generating means for generating pulse width modulation signals each for driving the switching elements and supplying the generated pulse width modulation signals to the switching amplifying means,
   wherein the switching amplifying means includes detecting means for detecting an operating state of the switching elements; and
   wherein the signal-generating means includes: dead-time-setting means for setting dead time relative to the switching elements by delaying each of the pulse width modulation signals using propagation delay time present in logic devices used therein; and
   control means for controlling the dead-time-setting means based on a detected result of the detecting means to change the dead time based on an operating state of the switching elements.

2. The class-D amplifier according to claim 1, wherein the control means controls the dead-time-setting means based on the detected result of the detecting means, to elongate the dead time when the switching elements enter into an operating state where losses in the switching elements are increased and the detected result reaches a predetermined threshold value and to shorten the dead time when the switching elements enter into an operating state where losses in the switching elements are decreased and the detected result reaches the predetermined threshold value.

3. The class-D amplifier according to claim 1, wherein said dead-time-setting means includes programmable logic device; and wherein said control means produces a program based on the detected result of the detecting means supplied to the dead-time-setting means, thereby allowing the dead time to vary.

4. The class-D amplifier according to claim 1, wherein the dead-time-setting means includes plural delay circuits each having a separate propagation delay time, each said delay circuit containing the logic device; and wherein said control means changes the dead time by selecting one of the delay circuits based on the detected result of the detecting means.

5. The class-D amplifier according to claim 1, wherein said detecting means detects temperatures of the switching elements as the operating state of the switching elements.

6. The class-D amplifier according to claim 1, wherein said detecting means detects electric currents flowing through the switching elements as the operating state of the switching elements.

7. A class-D amplifier comprising:

a switching amplifying unit which includes a pair of switching elements, said unit driving the switching elements and generating pulse-amplified switching signals; and a signal-generating unit which generates pulse width modulation signals each for driving the switching elements and supplies the generated pulse width modulation signals to the switching amplifying unit, wherein the switching amplifying unit includes a detecting sub-unit which detects an operating state of the switching elements; and wherein the signal-generating unit includes:

a dead-time-setting sub-unit which sets a dead time relative to the switching elements by delaying each of the pulse width modulation signals using propagation delay time present in logic devices used therein; and a control sub-unit which controls the dead-time-setting sub-unit based on a detected result of the detecting sub-unit to change the dead time based on an operating state of the switching elements.

* * * * *